US 6,658,053 B1

(12) United States Patent  (10) Patent No.: US 6,658,053 B1
Aiello et al.  (45) Date of Patent: Dec. 2, 2003

(54) PULSE SHAPING FOR A BASEBAND WIRELESS TRANSMITTER

(75) Inventors: G. Roberto Aiello, Palo Alto, CA (US); Gerald Rogerson, Morgan Hill, CA (US); Jacob Tuft, San Francisco, CA (US); Carlton J. Sparrell, Palo Alto, CA (US)

(73) Assignee: Pulse-Link, Inc., San Diego, CA (US)

( * ) Notice: Subject to any disclaimer, the term of this patent is extended or adjusted under 35 U.S.C. 154(b) by 0 days.

(21) Appl. No.: 09/408,414

(22) Filed: Sep. 29, 1999

(51) Int. Cl.[7] ............... H04B 3/46; H03K 19/094
(52) U.S. Cl. ............................ 375/224; 326/87
(58) Field of Search ................... 375/244, 295, 375/350; 326/87, 85, 81, 84

(56) References Cited

U.S. PATENT DOCUMENTS

| | | | | |
|---|---|---|---|---|
| 4,232,339 A | * | 11/1980 | Smiley et al. | 348/495 |
| 4,587,494 A | * | 5/1986 | Widlar | 330/273 |
| 5,146,616 A | | 9/1992 | Tang et al. | 455/103 |
| 5,253,202 A | * | 10/1993 | Bronner et al. | 365/149 |
| 5,274,271 A | | 12/1993 | McEwan | 307/108 |
| 5,307,079 A | | 4/1994 | Ross et al. | 343/822 |
| 5,319,218 A | | 6/1994 | Kim et al. | 257/1 |
| 5,546,022 A | * | 8/1996 | D'Souza et al. | 326/121 |
| 5,815,537 A | | 9/1998 | Janssen | 375/350 |
| 6,067,648 A | * | 5/2000 | Hunter et al. | 714/718 |
| 6,133,875 A | * | 10/2000 | Kishimoto | 342/375 |

* cited by examiner

Primary Examiner—Khai Tran
(74) Attorney, Agent, or Firm—Luce Forward Hamilton & Scripps LLP

(57) ABSTRACT

A method and apparatus for generating a baseband signal from a data pulse to approximate a filter transfer function is disclosed. The method comprises generating the data pulse, generating a plurality of delayed short pulses from the data pulse, and generating an output baseband signal from the of delayed pulses. The apparatus for generating a baseband signal from a data pulse to approximate a filter transfer function, comprises an input node coupled to the data pulse, an output node, a pull-up circuit coupled to said output node which generates positive going excursions of the baseband signal, and a pull-down circuit coupled to said output node which generates negative going excursions of the baseband signal.

11 Claims, 13 Drawing Sheets

PULSE SHAPING FOR A BASEBAND WIRELESS TRANSMITTER

BACKGROUND OF THE INVENTION

1. Field of the Invention

This invention pertains generally to an apparatus and method for generating a desired shape for baseband wireless communication. More particularly, the invention relates to an apparatus and method for generating a baseband signal from an input pulse.

2. The Prior Art

The prior art teaches pulse shaping techniques for baseband systems. One of the prior art pulse generators is disclosed in U.S. Pat. No. 5,146,616 issued to Tang et. al. and describes an ultra wideband radar transmitter employing synthesized short pulses. The patent provides an impulse radar apparatus employing multiple transmitters and receivers. Each transmitter operates in a continuous wave mode in which all the spectral components are transmitted together. To achieve phase coherency in all transmitters, a master oscillator is coupled to a harmonic generator which provides all the required spectral components to drive a plurality of final amplifiers. The signals from the final amplifiers are coupled by a plurality of duplexers to a broadband multiplexing antenna which forms a high gain beam. The patent describes generating and radiating a pulse train that is representative of a predetermined desired radar signal to be synthesized in space. Rather than generating a signal in real time by switching a radio frequency transmit signal on and off, in the patent the individual spectral components are generated and transmitted instead. The spectral components have uniform amplitudes and are evenly spaced apart.

Another prior art pulse generator is disclosed in U.S. Pat. No. 5,274,271 issued to McEwan which describes an ultra-short pulse generator. The ultra-short pulse generator is an inexpensive circuit that generates ultra-short, 200 picosecond, and high power 100 kW, pulses suitable for wideband radar and other wideband applications. The patent discloses a driver circuit in which the driver circuit furnishes a high-voltage, step-like input pulse that increases in voltage, and decreases in duration as it passes through the transmission line. The transmission line comprises a series of stages with each stage having an inductor and one or more diode-capacitors. Each stage sharpens and raises the voltage peak of the step-like input from the driver circuit. The length of the transmission line is chosen so that the voltage step at the final stage induces transit time avalanche breakdown in a diode that is placed in a suitable breakdown circuit at the output of the nonlinear transmission line. This advantageously sharpens the output pulse of the circuit even more, making it short enough for use in many broadband applications.

Another prior art pulse generator is disclosed in U.S. Pat. No. 5,307,079 issued to Ross which describes a short pulse microwave source with a high pulse repetition frequency and low power drain. The patent describes a high voltage, very short pulse, microwave radiating source using low-cost components, and capable of operating at high pulse repetition frequencies. The source is activated by an ordinary video trigger which is capable of driving TTL logic. A trigger will cause a chain of N (where N may be 12 or greater) avalanche transistors connected in a Marx generator configuration to threshold. Thus, resulting in a 1,200 volt or greater baseband pulse having a rise time of less than 100 ps and a duration of about 3 ns driving the input port of a dipole antenna. The Marx generator configuration permits one to charge a bank of capacitors in parallel from a low battery voltage and then discharge them in series creating a high voltage pulse. The circuit assures that the capacitors are charged during a short interval before application of the main avalanche trigger, and the power supply is disconnected just prior to triggering the modified Marx generator.

Another prior art pulse shaping-generator is disclosed in U.S. Pat. No. 5,319,218 issued to Kim et. al. which describes pulse sharpening using an optical pulse. The patent describes a monolithic, photoconductive impulse generating device having metalized electrodes on two opposing surfaces. A laser light is optically connected to each surface through a fiber optic cable where the cable leading to one surface differs in length from the cable leading to the other surface by some predetermined amount. As such light energy passing through the longer cable will arrive at its respective surface at some predetermined time after the light passing through the shorter cable. Consequently, the energy discharge that is triggered by the light passing through the shorter cable will be abruptly terminated by the light passing through the longer cable.

Another prior art pulse shaping generator is disclosed in U.S. Pat. No. 5,815,537 issued to Janssen which describes a wireless digital communication device, and a pulse shaping network. The pulse shaping network comprises a shift register to which data to be modulated are fed. Outputs of the shift register are connected to control inputs of switched weighted current sources which are summed. The amplitude of the shaped pulse can be accurately determined by adjusting the input voltage of the pulse shaping network.

These aforementioned approaches and examples apply pulse shaping techniques to baseband systems. The short pulses are generated by having multiple transmitters operating at the same time (as described in Tang et. al.), by sharpening pulses with a nonlinear transmission line (as described in McEwan), with avalanche transistors (as described in Ross), with optical pulses (as described in Kim), or with a weighted current network (as described in Janssen). However, none of these approaches or examples teaches an apparatus or method which is presented with a data pulse and generates a series of delayed short pulses that are combined to generate a baseband signal which closely approximates a filter's transfer function.

Accordingly, it is an object of the invention is to provide an apparatus to be used for wireless communication that generates a series of delayed short pulses which generate a baseband signal which closely approximates a filter's shape.

Another object of the invention is to provide a baseband signal generator apparatus and method for shaping a pulse for transmission.

Another object of the invention is to provide a baseband signal generator capable of operating at frequencies in the gigahertz range.

Another object of the invention is to provide a baseband signal generator that uses pull-up circuits and pull-down circuits to generate output signals in the gigahertz range.

Other objects, together with the foregoing are attained in the exercise of the invention in the following description and resulting in the embodiments described with respect to the accompanying drawings

BRIEF DESCRIPTION OF THE INVENTION

The present invention is an apparatus and method which maximizes the energy transfer through a filter by matching the shape of the signal to the filter's transfer function. The filters transfer function is approximated using inexpensive digital circuits which generate a series of delayed short pulses that are combined to generate an output baseband signal that approximates the shape of the filters transfer function.

In its preferred embodiment, the present invention is a baseband signal generator that generates an output signal from data pulses. The baseband signal generator of the present invention comprises a pull-up circuit and a pull-down circuit which generate the baseband output signal that approximates the shape of the filter transfer function. The pull-up circuit includes a transistor drive system having a pnp bipolar transistor which produces positive going signal excursions. The pull-down circuit also includes the transistor drive system having a npn bipolar transistor which produces negative going signal excursions. The composite of the positive going signal excursions and the negative going signal excursions generate the output baseband signal that approximates the shape associated with the filter transfer function.

By way of example and not of limitation, the output baseband signal may have a spectral content bandwidth which matches the filter bandwidth between 2.5 GHz to 5.0 GHz. Note that in the preferred embodiment, the filter is an antenna transmitting signals between 2.5 GHz and 5.0 GHz. At these operating frequencies, the capacitance at the base-emitter junction of the bipolar transistors prevents the bipolar transistors from rapidly turning off. To ensure rapid turnoff of the transistors, the present invention generates "turn off" signals to discharge the capacitance at the base-emitter junction and turns off the transistor.

Therefore, the pnp pull-up transistor is operated using a pair of signals including a pull-up turn-on signal and a pull-up turn-off signal. The pull-up turn-on signal activates the pnp transistor and generates an output pulse. The pull-up turn-off signal is presented to the pnp transistor which discharges the base emitter capacitive charge to turn off the pnp transistor. The combination of the pull-up turn-on signal and the pull-up turn-off signal produces a positive going signal excursion for the output baseband signal.

The pull-down circuit operates in a similar manner as the pull-up circuit. The npn pull-down transistor is operated using a pair of signals including a pull-down turn-on signal and a pull-down turn-off signal. The pull-down turn-on signal activates the npn transistor and generates an output pulse. The pull-down turn-off signals discharge the base emitter capacitance of the npn transistor to turn it off. In combination the pull-down turn-on signal and pull-down turn-off signal generates negative going signal excursions for the output baseband signal. The composite of the positive going signal excursions and negative going signal excursions generate a baseband output representing a binary "1".

The pull-up circuits and pull-down circuits also include a pulse generator system. The pulse generator system is comprised of one or more pulse generators. In operation, the pulse generating system presents the rising edge of an input transmit pulse to the one or more pulse generators. The pulse generator system generates output signals that are presented to the transistor drive system as pull-up turn-on signals, pull-up turn-off signals, pull-down turn-on signals, and pull-down turn-off signals.

Each pulse generator includes one or more pairs of coupled edge delay circuits. The edge delay circuits function in pairs where the first edge delay circuit generates the leading edge for the delayed pulse signal and the second edge delay circuit generates the trailing edge for the delayed pulse signal. Each edge delay circuit may comprise a switched bank of capacitors that provide a programmable edge delay. The outputs from each pair of edge delay circuits are combined to produce a composite series of delayed output pulses. The delayed output pulses from the one or more pulse generators are presented as pull-up turn-on signals, pull-up turn-off signals, pull-down turn-on signals, and pull-down turn-off signals to the transistor drive system having the pnp and npn bipolar transistors described above.

It shall be appreciated by those with ordinary skill in the art that the pnp transistors and npn transistors may be external or internal to the digital circuit. Additionally, an alternative embodiment exists where pnp transistor of the pull-up circuit and the npn transistor of the pull-down circuit are not used and the pull-up signals and pull-down signals are coupled to a load. More particularly, the current source line and sink line are tied together to a node which drives a load, such as an antenna, in a current drive configuration, using a current to produce an electric field on the antenna.

BRIEF DESCRIPTION OF THE DRAWING FIGURES

The present invention will be more fully understood by reference to the following drawings, which are for illustrative purposes only.

FIG. 1b is a pulse in the time domain of FIG. 1a.

DETAILED DESCRIPTION OF THE PREFERRED EMBODIMENTS

Persons of ordinary skill in the art will realize that the following description of the present invention is illustrative only and not in any way limiting. Other embodiments of the invention will readily suggest themselves to such skilled persons having the benefit of this disclosure.

Figure 1A:
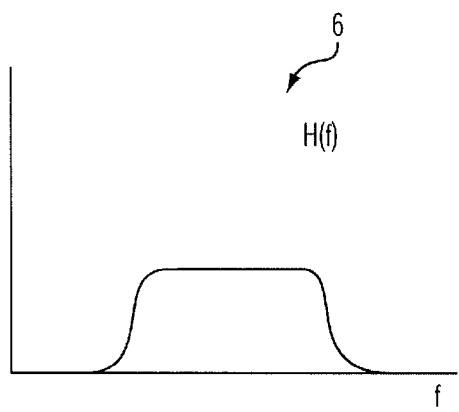
FIG. 1a is a filter transfer function H(f) in the frequency domain.
Figure 1B:
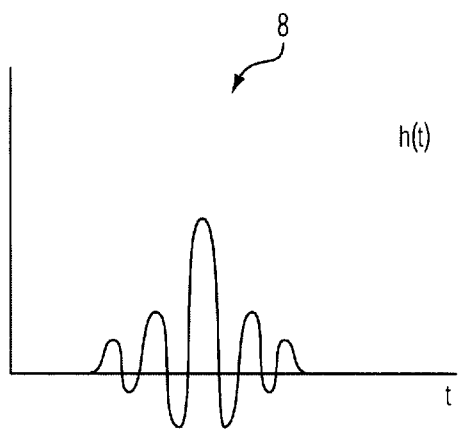
Figure 1C:
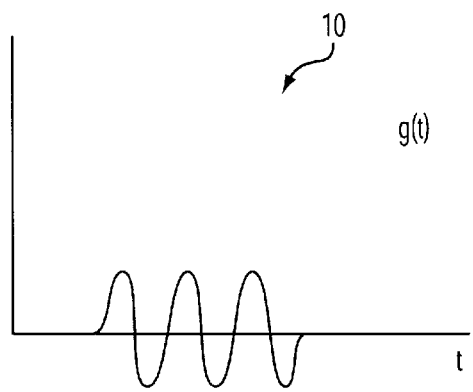
FIG. 1c is a shape generated by the invention in the time domain.
Figure 1D:
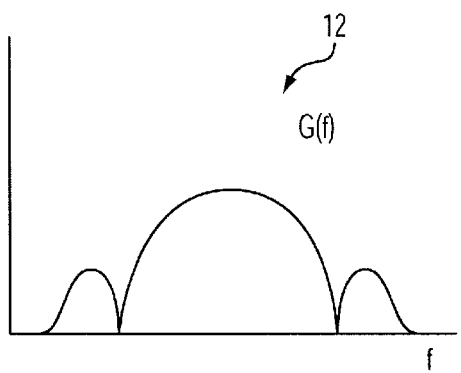
FIG. 1d is the frequency spectrum for the shape in FIG. 1c.

Referring to FIG. 1a there is shown a curve 6 of a filter transfer function in the frequency domain. FIG. 1b shows a waveform 8 that produces the filter transfer function of FIG. 1a. The present invention maximizes the energy transfer through the filter by approximating the shape of the filter's transfer function. FIG. 1c shows a waveform 10 generated by the present invention comprising a series of delayed short pulses which closely approximate waveform 8. FIG. 1d shows a curve 12 in the frequency domain which is defined by the delayed short pulses of waveform 10. Notice that waveform 12 closely approximates waveform 6.

Figure 2:
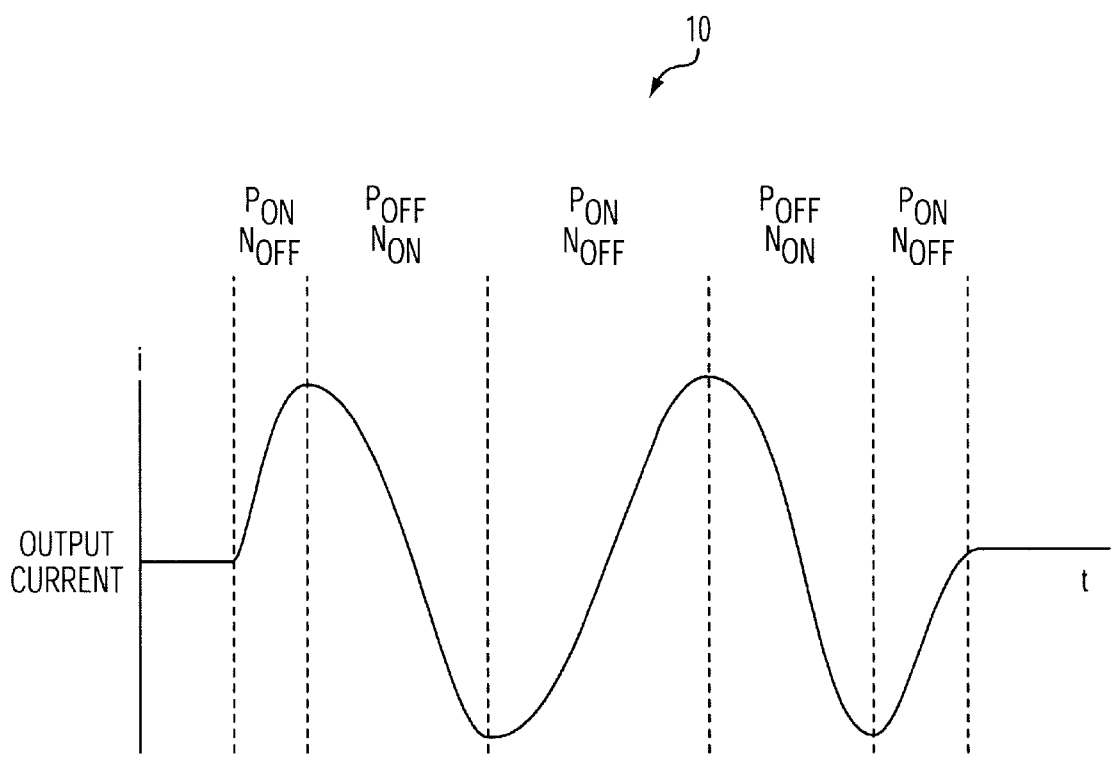
FIG. 2 is more detailed view of the output waveform in FIG. 1c as generated by the baseband signal generator.

The present invention is an apparatus and method for generating the series of short delay pulses which closely approximates the filter transfer function. The present invention is generated with the digital and analog circuits described below. Referring now to FIG. 2, there is shown a more detailed view of waveform 10 in the time domain for the output signal generated by the present invention. The present invention comprises a signal generator which includes a pull-up circuit and a pull-down circuit that produce the output waveform 10. By way of example and not of limitation, the output waveform 10 may have a spectral content bandwidth between 2.5 GHz to 5.0 GHz.

Figure 3:
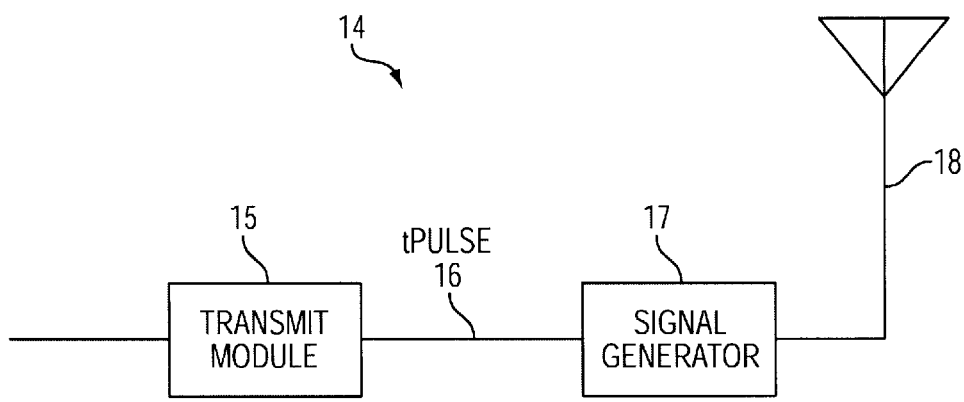
FIG. 3 is a functional block diagram of a system which uses the baseband signal generator.

Referring now to FIG. 3, there is shown generally an overall block diagram of a transmitting system 14 according to the present invention. The transmitting system 14 comprises a data transmit module 15 which generates digital transmit pulse signals 16, a signal generator 17, and an antenna 18. Transmit pulse signals 16 are communicated to signal generator 17 to generate signals. The logic circuits used in the signal generator 17 preferably use complimentary metal oxide semiconductor (CMOS) technology. However, persons with ordinary skill in the art will appreciate that other technologies well known in the art of digital circuit design may also be used. The output from the signal generator are provided to a suitable antenna 18.

Figure 4:
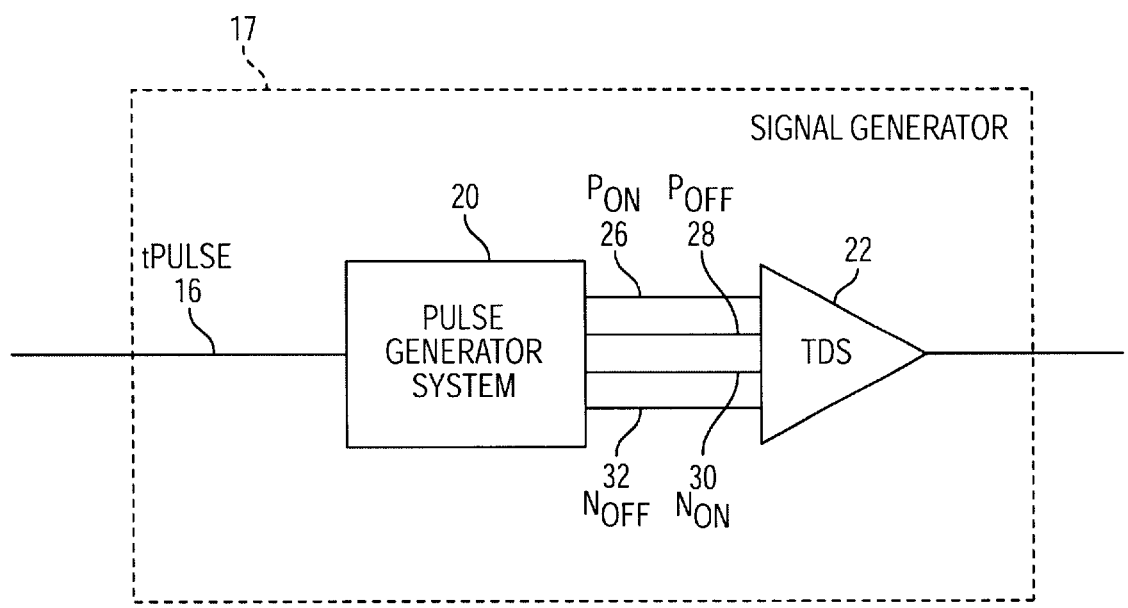
FIG. 4 is a simple functional block diagram of baseband signal generator.

Referring now to FIG. 4, there is shown a functional block diagram of the signal generator system. The pull-up and pull-down circuits of the signal generator system 17 comprise a pulse generator system 20 and a transistor drive system 22. The pulse generator system 17 is presented with an input transmit pulse signal 16 and generates a plurality of pairs of pull-up turn-on pulses (identified as Pon), and pull-up turn-off pulses 28 (identified as Poff), a plurality of pairs of pull-down turn-on pulses 30 (identified as Non) and pull-down turn-off pulses 32 (identified as Noff). These pulses are used to drive the transistor driver system 22.

Figure 5:
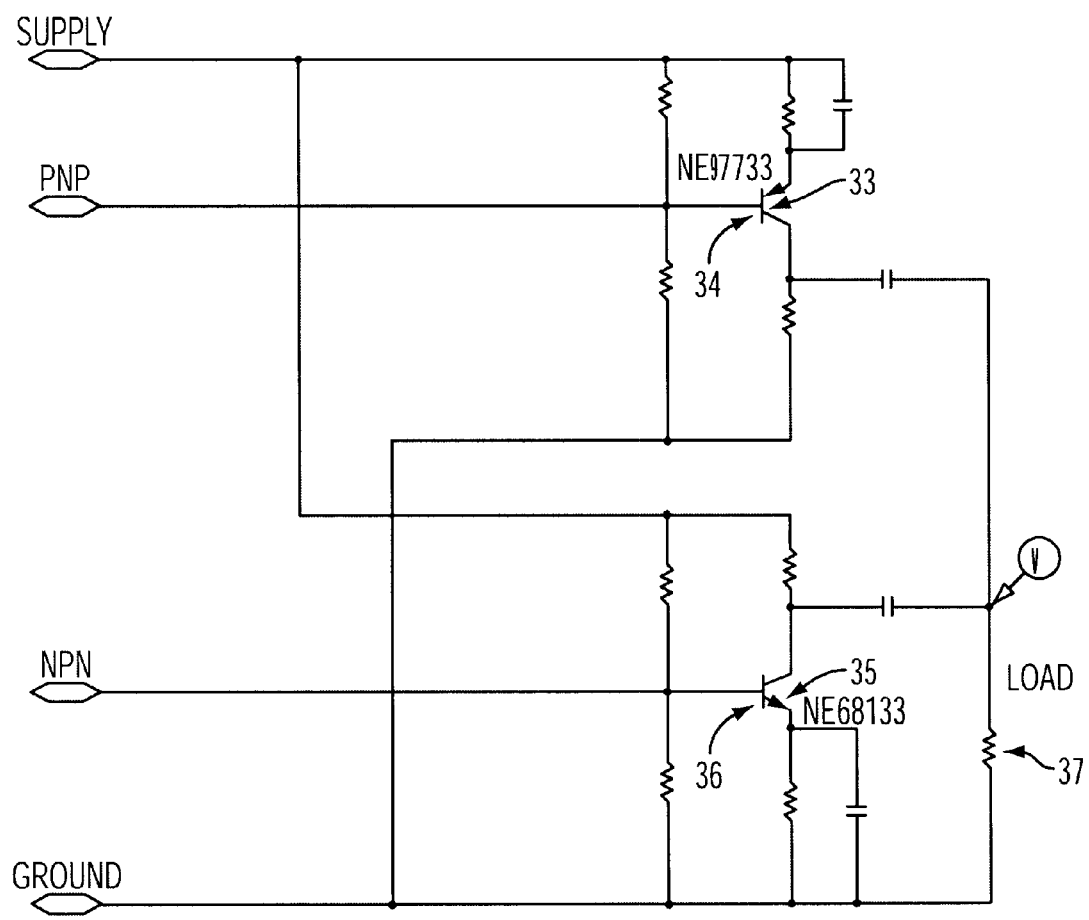
FIG. 5 is a circuit diagram of the bipolar transistors which generate the output waveform in FIG. 2.

Referring to FIG. 5, there is shown a schematic diagram of transistor driver system 22 which may be used to generate the output signal of FIG. 2. The pull-up circuit which generates the positive going signal excursion includes a bipolar pnp transistor 33. The pnp transistor 33 is a pull-up transistor in a common emitter configuration that receives the pull-up signals at its base 34. The pull-down circuit which generates the negative going signal excursion includes a bipolar npn transistor 35. The npn transistor 35 is a pull-down transistor in a common emitter configuration that receives the pull down signals at its base 36. The outputs from the bipolar transistors are capacitively coupled to a load 37. The load 37 may be an antenna which radiates the output signal.

As previously noted, the output signal generated by the signal generator may operate, for example, between 2.5 GHz to 5.0 GHz. At these operating frequencies, the base-emitter capacitance at each transistor 35 and 37 prevents the bipolar transistors from rapidly turning off. To ensure rapid turnoffs of the pnp transistor 33 and the npn transistor 35, the present invention generates "turn off" signals which are presented to transistors 33 and 35. The turn-off signals discharge the base-emitter capacitance at each transistor 33 and 35. The discharging of the base-emitter capacitive charge turns off the transistors.

Figure 6:
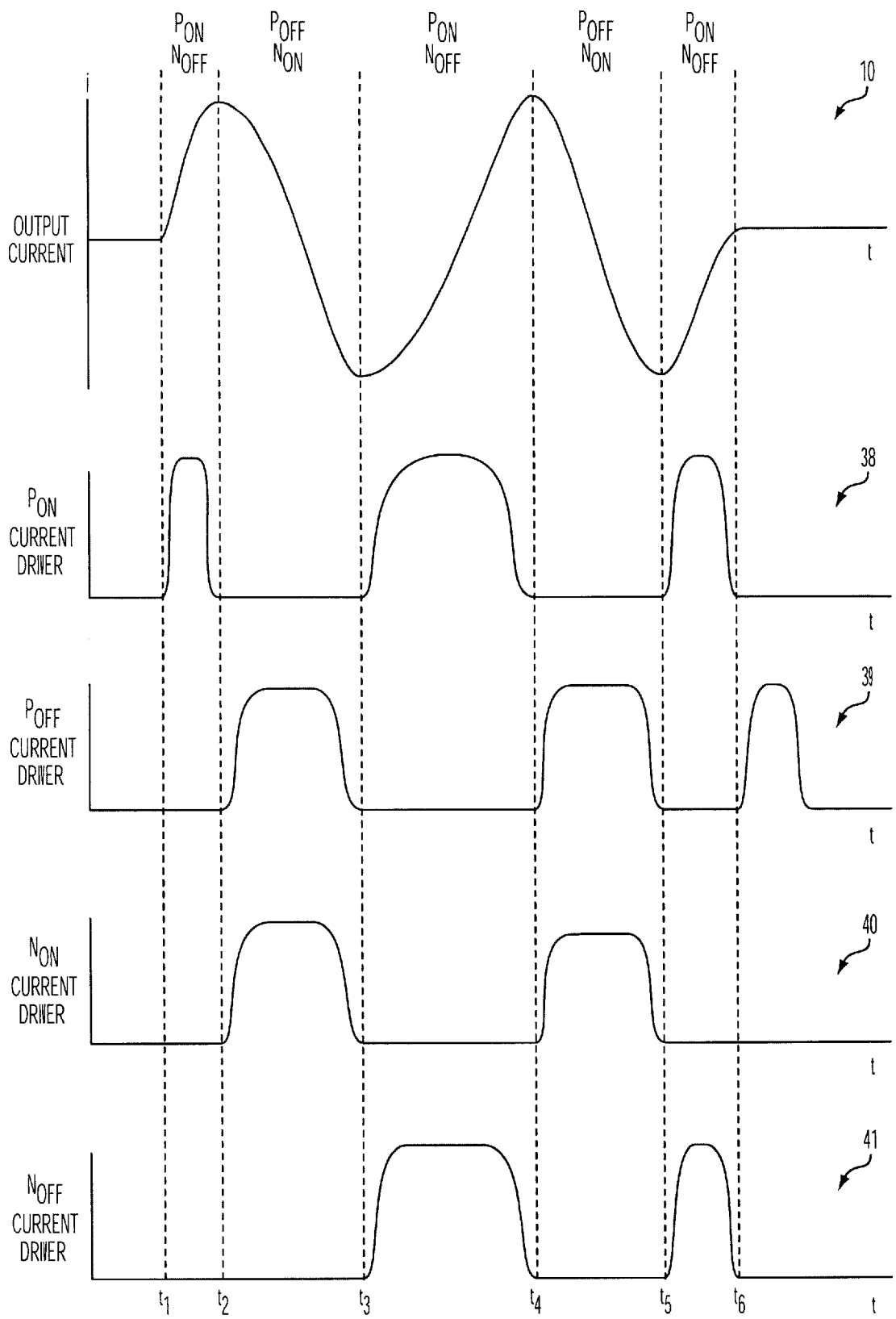
FIG. 6 is a series of waveforms produced by the baseband signal generator to generate the output waveform in FIG. 2.

Referring to FIG. 6, there is shown a series of waveforms generated by the transistor drive system and presented to the transistor drive system. The first waveform 10 of FIG. 6 is the same output waveform shown in FIG.2. The subsequent waveforms 38, 39, 40 and 41 are presented to transistors 33 and 35 to generate the output waveform 10.

More particularly, the pnp transistor 33 is driven with a plurality of pull-up turn-on signals and a plurality of pull-up turn-off signals. The pull-up turn-on signals are identified as the Pon signal and are shown in plot 38. The pull-up turn-off signals are identified as the Poff signals and are shown in plot 39. The pull-up circuit generates signals 38 and 39 which are communicated to the pnp transistor 33. In operation, the pull-up turn-on signal 38 activates the pnp transistor 33 generating an output pulse. After the pull-up turn signal 38 is communicated to the pnp transistor 33, the pull-up turn-off signals 39 are presented to the pnp transistor 33. Once received by the pnp transistor 33, the pull-up turn-off signals 39 discharge the base emitter capacitance of the npn transistor 33, effectively turning off the pnp transistor 33. In combination the pull-up turn-on signal 38 and pull-up turn-off signal 39 produces a positive going signal excursion for the baseband signal.

The pull-down circuit operates in a similar manner as the pull-up circuit. The npn pull-down transistor is driven with a plurality of pull-down turn-on signals 40 and a plurality of pull-down turn-off signals 41. The pull-down turn-on signals are identified as the Non signals and are shown in plot 40. The pull-down turn-off signals are identified as the Noff signals and are shown in plot 41. In operation, the pull-down turn-on signal 40 activates the npn transistor 35 and generates an output pulse for transmission. The pull-down turn-off signals discharge the base emitter capacitance of the npn transistor 35, thereby turning off the npn transistor 35. In combination the pull-down turn-on signal 40 and pull-down turn-off signal 41 generates a negative going signal excursion for the output signal 10. The composite of the positive going signal excursion and the negative going signal excursions generate output signals 10 which represents a binary "1".

Figure 7:
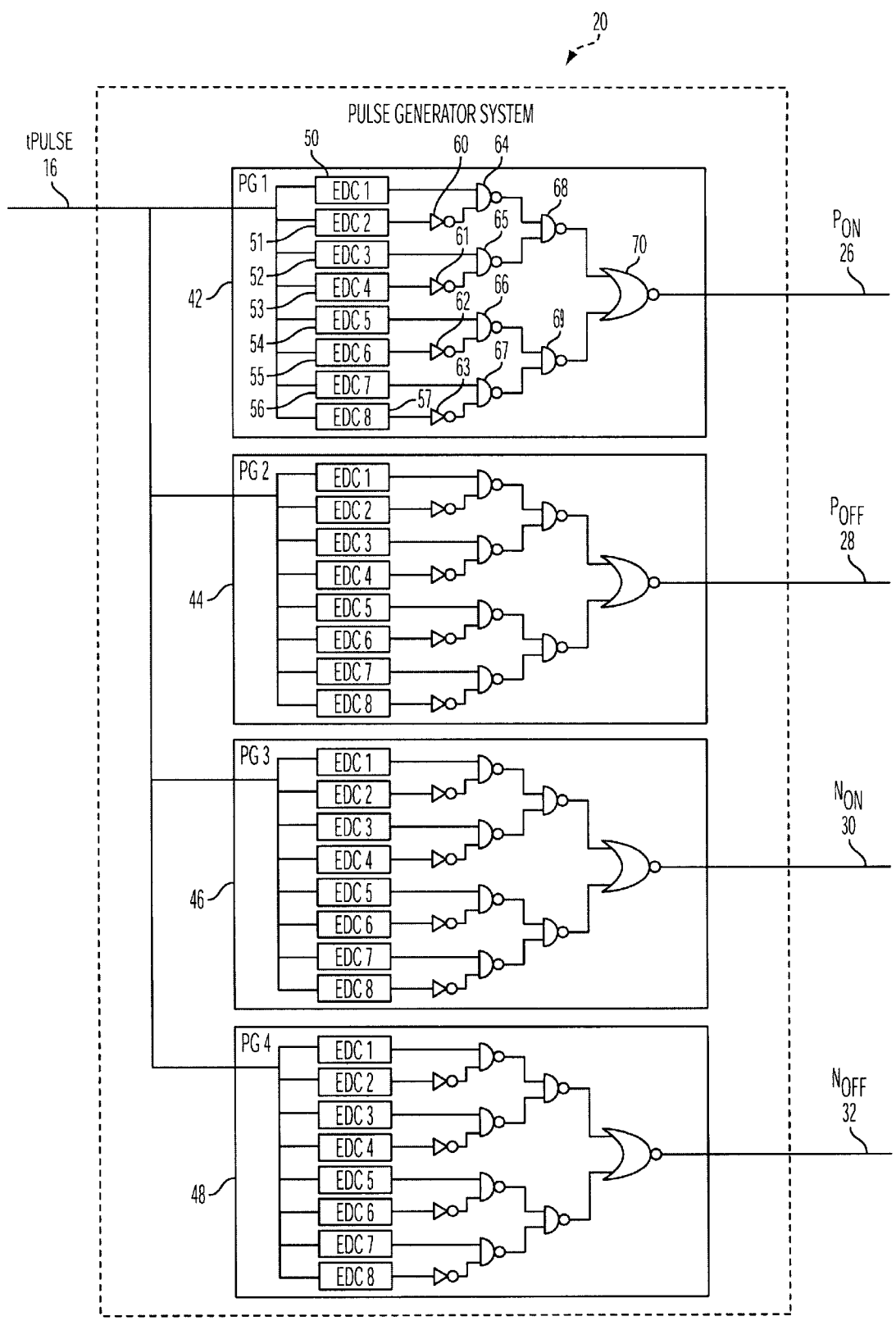
FIG. 7 is a top-level functional block diagram of the baseband signal generator.

Referring to FIG. 7, there is shown a block diagram of the pulse generator system 20. The pulse generator system comprises four pulse generators 42, 44, 46 and 48 which generate pull-up turn-on signals 26 (described as Pon), pull-up turn-off signals 28 (described as Poff), pull-down turn-on signals 30 (described as Non), and pull-down turn-off signals 32 (described as Noff), respectively.

By way of example and not of limitation, the operation of pulse generator 42 is evaluated in further detail. Pulse generator 42 is presented with the rising edge of an input transmit pulse 16. Generally, the rising edge 16 is communicated to a plurality of paired edge delay circuits, which include paired edge delay circuits 50 and 51, 52 and 53, 54 and 55, and 56 and 57. Each pair of edge delay circuits is associated with-generating a pulse having a leading and a trailing edge.

Each edge delay circuit generates a leading edge which is delayed by particular time interval tn, where n is an integer.

The trailing edge for each pulse is generated by inverting one of the pair of leading edges. By way of example edge delay circuits 51, 53, 55 and 57 are coupled to inverters 60, 61, 62 and 63, respectively and generate trailing edges. A first plurality of NAND gates 64, 65, 66 and 67 combines the leading and trailing edges to generate a pull-up turn-on pulse. A second plurality of NAND gate 68, NAND gate 69 and NOR gate 70 combine the outputs of NAND gates 64, 65, 66 and 67 generating plurality of pull-up turn-on pulses identified as Pon 26.

Figure 8:
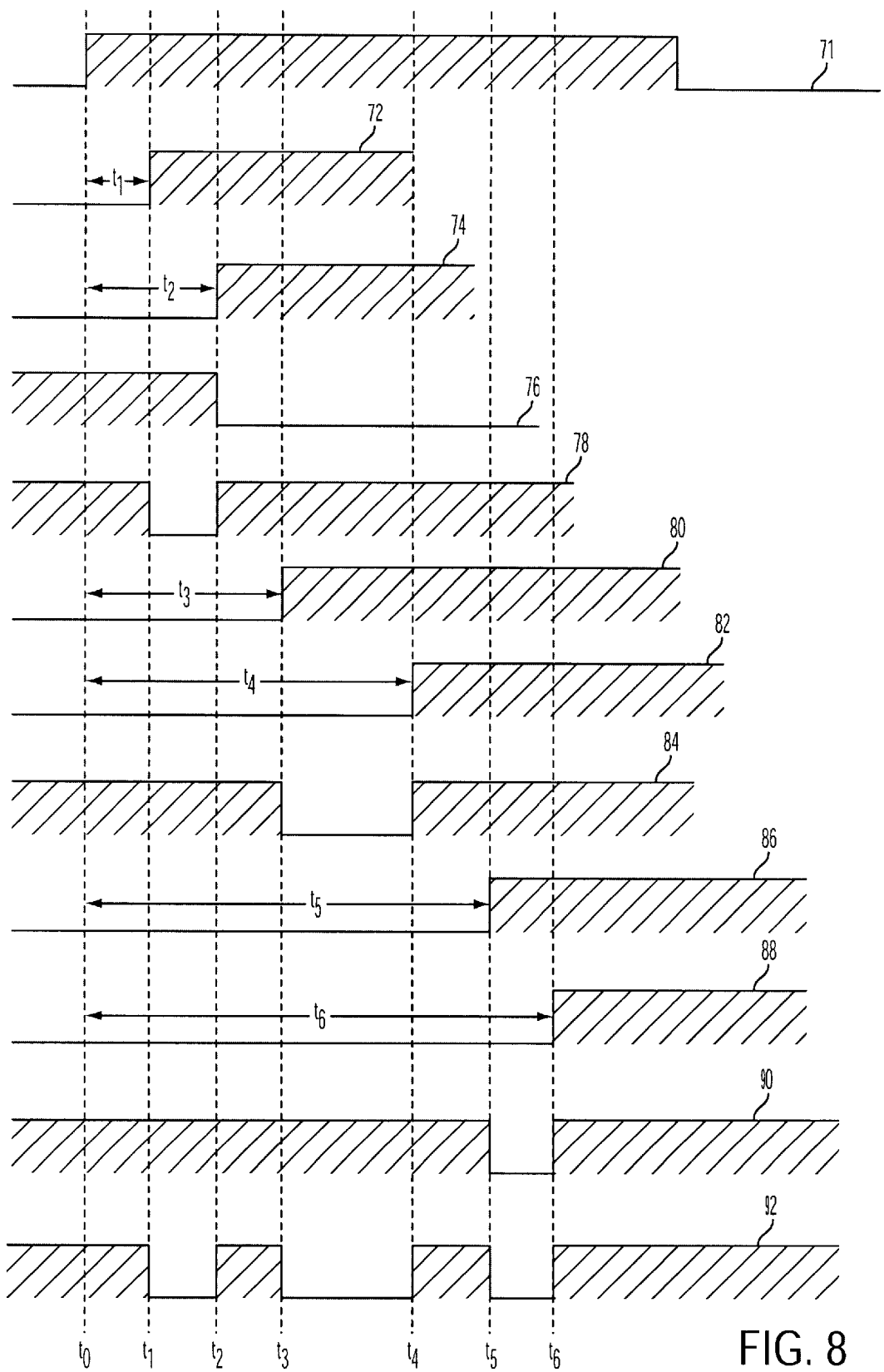
FIG. 8 is a diagram of waveforms generated by the pulse generator.

FIG. 8 shows the input and outputs generated by three pairs of edge delay circuits resident in pulse generator 42. Although four pairs of edge delay circuits are provided in FIG. 7, the specific number of pairs of edge delay circuits for each pulse generator is not a limiting feature of the invention. Waveform 71 depicts the input pulse 26 which is presented to each edge delay circuit. Waveform 72 is generated by edge delay circuit 50 which produces a leading edge delayed by a time $t_1$. Waveform 74 shows an edge generated by circuit 51 that is delayed by time $t_2$. The edge generated by circuit 51 is inverted by inverter 60 to generate a trailing edge waveform 76. NAND gate 64 combines the leading edge at time $t_1$ with the trailing edge at time $t_2$ to generate a pulse signal as shown in waveform 78.

A similar process occurs for each pair of edge delay circuits. Waveform 80 and 82 illustrate the delayed leading edges generated by edge delay circuit 52 and 53. As described previously, the leading edge from circuit 53 is inverted generating a trailing edge for a pulse. Waveform 84 shows the pulse signal generated by combining leading edge 80 at $t_3$ with trailing edge 82 at $t_4$ using NAND gate 65. This process is once again repeated by edge delay circuits 54 and 55 which generate delayed leading edges 86 and 88, respectively. The output from circuit 55 is inverted at $t_6$ and combined with output from circuit 54 at $t_5$ using NAND gate 66 to generate the pulse shown in waveform 90.

The pulsed output waveforms 78, 84, and 90 are combined with NAND gate 68 and 69 which are coupled to a NOR gate 70 to produce an output waveform 92. The output waveform 92 is the pull-up turn-on signal that is presented to the transistor drive system 22. Note that each of the remaining pulse generators 44, 46 and 48 generate output waveforms in a substantially similar manner as pulse generator 42.

To produce an output waveform such as waveform 92, each pulse generator must be programmed or configured to generate a specific number of pulses at particular times for specific durations. The specific number of pulses in the pulse generator output signal is configured by enable signals that regulate which edge delay circuits receive rising edge input 16.

Figure 9:
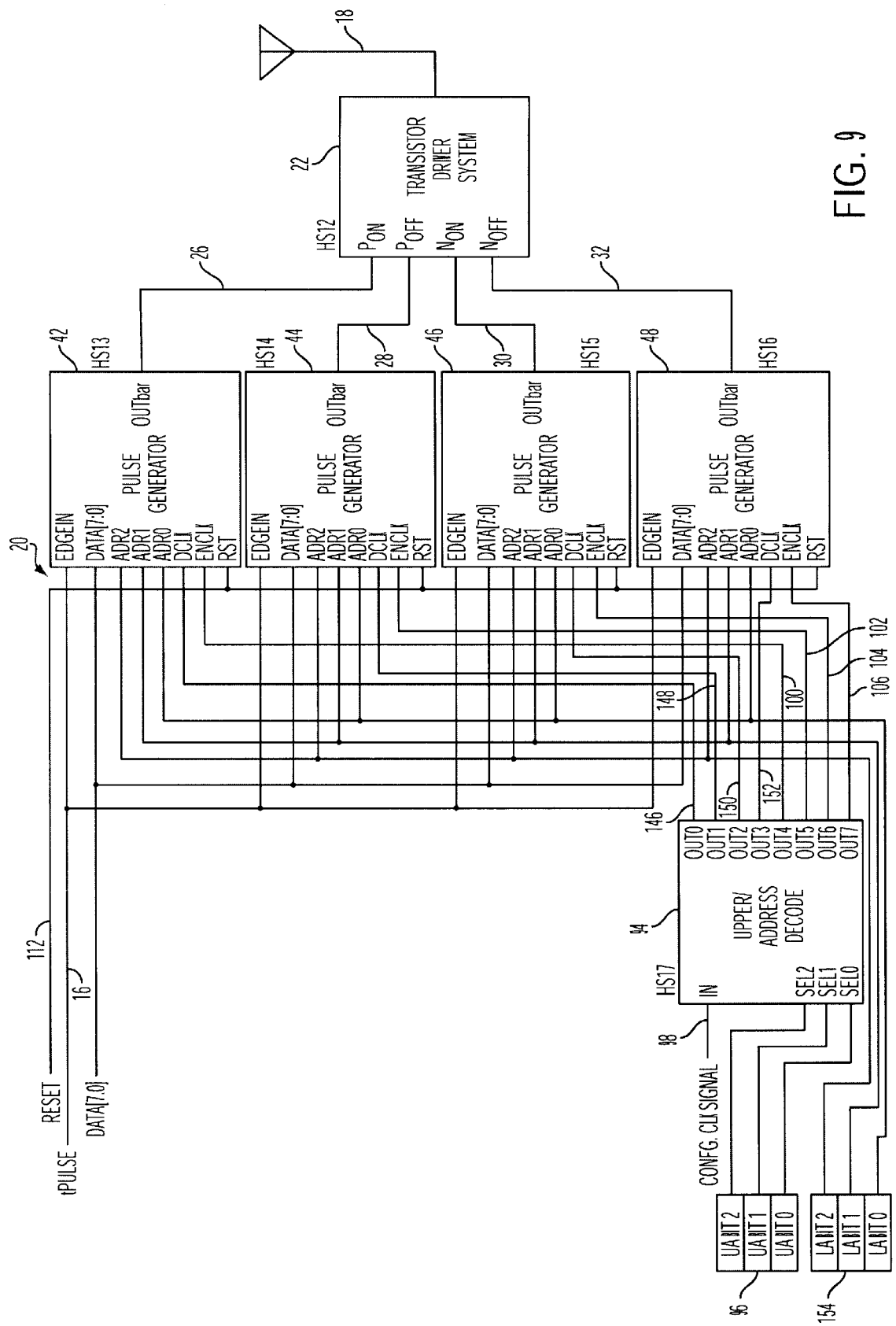
FIG. 9 is a functional block diagram of a pulse generator.
Figure 10:
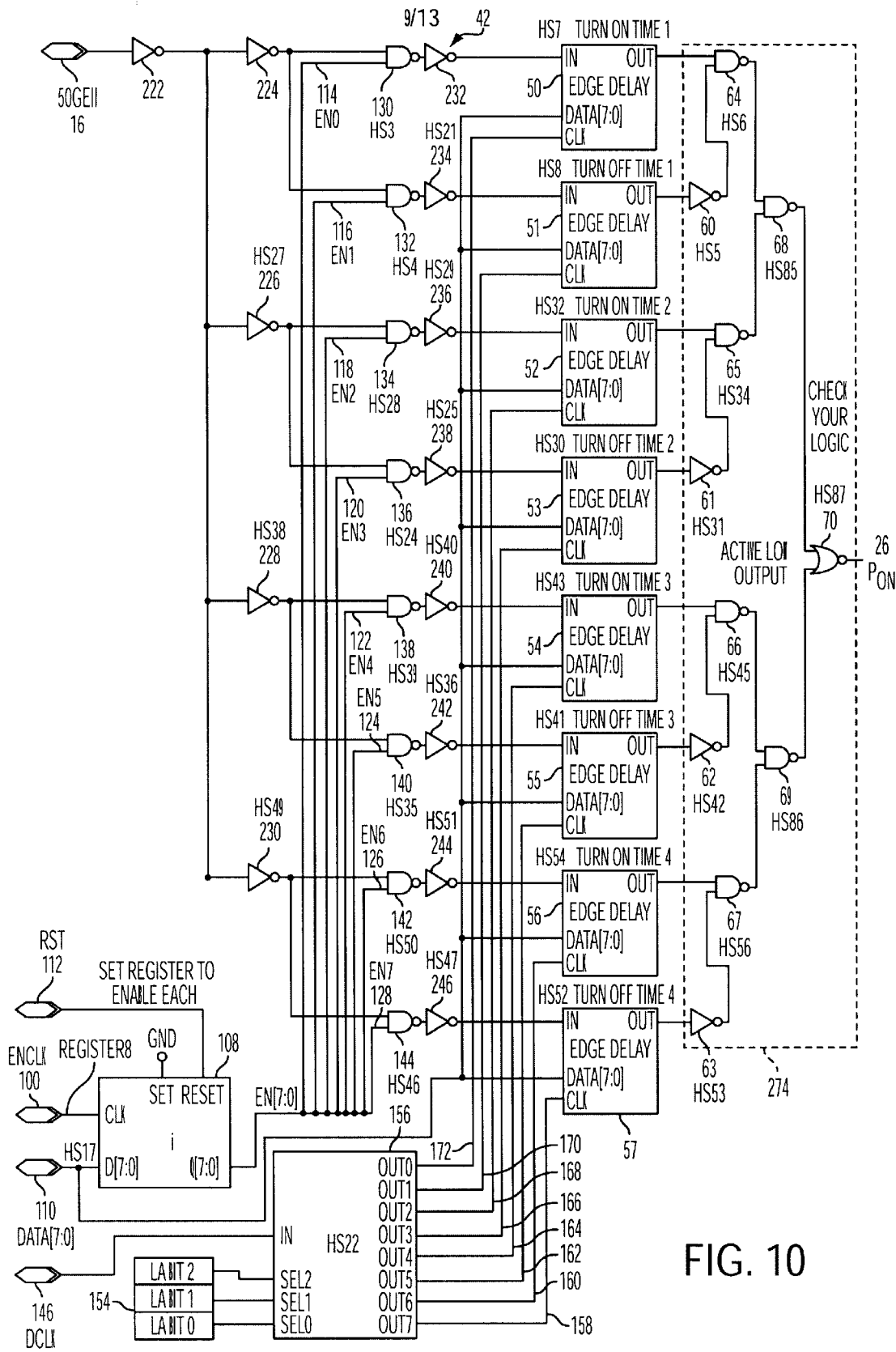
FIG. 10 is a timing diagram showing the output generated at various locations of the pulse generator.

Referring to FIG. 9 and FIG. 10 there is shown a schematic of the signal generator and a schematic of pulse generator 42, respectively. To configure the enable signals an upper address decoder 94 (shown in FIG. 9) is presented with a 3-bit upper address signal 96 and a configuration clock signal 98. The upper address decoder 94 generates enable clocking signals 100, 102, 104 and 106 that are presented to an enable register in each pulse generator. By way of example and not of limitation, an enable register 108 for pulse generator 42 is shown in FIG. 10. Enable register 108 is presented with the enable clocking signal 100, an 8-bit data signal 110, and a reset 112. Enable register 108 generates a plurality of one-bit enable outputs 114, 116, 118, 120, 122, 124, 126, and 128 each of which is presented to each NAND gate 130, 132, 134, 136, 138, 140, 142 and 144, respectively. When a particular NAND gate is enabled the rising edge of input pulse 16 is presented to the next logic gate or circuit. If the NAND gate is not enabled the rising edge of the input pulse 16 is not presented to the next logic gate or circuit.

The pulse generators are also pre-configured or programmed to generate a particular delay for each edge delay circuits. More specifically, the particular time delay for each edge delay circuit is configured by delay signals which are presented to a switchable capacitor bank that configures the edge delay circuit to generate the particular delay for each edge.

Figure 11:
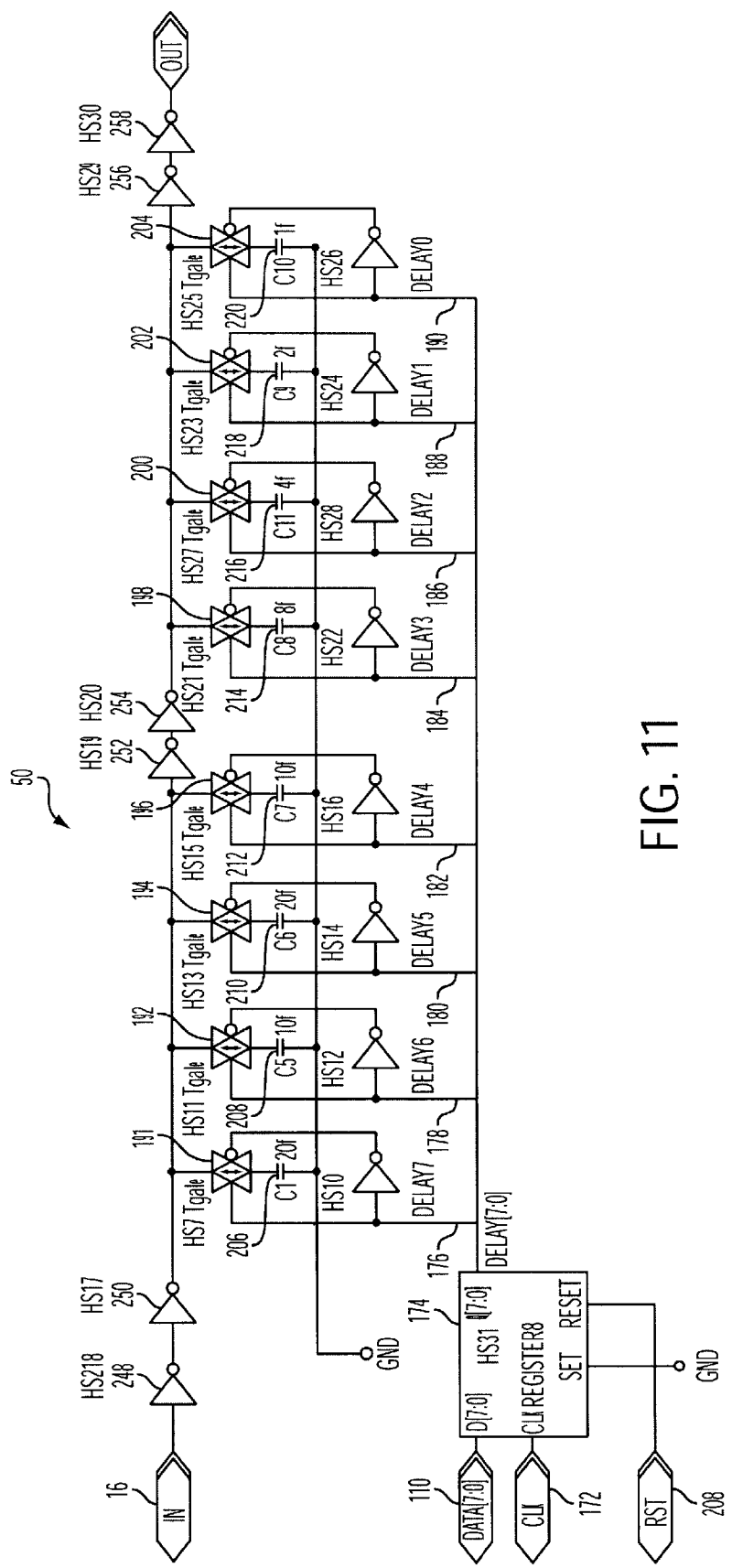
FIG. 11 is a circuit diagram for an edge delay circuit.

Referring to FIG. 9, FIG. 10 and FIG. 11 there is shown a schematic of the signal generator, a schematic of a particular pulse generator, and a schematic of an edge delay circuit, respectively. To configure the delay signals for each edge delay circuit, the upper address decoder 94 generates data clocking signals 146, 148, 150 and 152 that are presented to each pulse generator. Each pulse generator presents the data clocking signals 146, 148, 150 and 152 and a 3-bit lower address signal 154 to a lower address register. By way of example and not of limitation, for pulse generator 42 the lower address register 156 generates delay clocking signals 158, 160, 162, 164, 166, 168, 170 and 172 that are presented to each edge delay circuit 50, 51, 52, 53, 54, 55, 56 and 57. Edge delay circuit 50 (on FIG. 11) presents the delay clocking signals 172 and the 8-bit data signal 110 to a delay register 174 which generates a plurality of one-bit delay signals 176, 178, 180, 182, 184, 186, 188 and 190 that are communicated to a plurality of transmission gates 191, 192, 194, 196, 198, 200, 202 and 204 that are coupled to a plurality of capacitors 206, 208, 210, 212, 214, 216, 218 and 220. The transmission gates 191, 192, 194, 196, 198, 200, 202 and 204 which are coupled to the capacitors 206, 208, 210, 212, 214, 216, 218 and 220 provide a switchable capacitor bank that is configured by the one-bit delay signals 176, 178, 180, 182, 184, 186, 188 and 190. The configured capacitor bank generates the desired delay for each particular edge. By way of example and not of limitation the capacitors 250, 266, 268, 270, 272, 274, 276 and 278 have values of 90 femtofarads, 40 femtofarads, 20 femtofarads, 10 femtofarads, 8 femtofarads, 4 femtofarads, 2 femtofarads, and 1 femtofarads, respectively.

The edge delay circuit 50 of FIG. 11 uses the switchable variable RC circuit to he generate the variable time delays for the input rising edge 16. Notice that the same design principles used for edge delay circuit 50 are also used with each edge delay circuits 51, 52, 53, 54, 55, 56 and 57 of pulse generator 42. Additionally, the edge delay circuit design for pulse generator 42 is similar to the edge delay circuit designs for pulse generators 44, 46, and 48.

In operation, the input transmit pulse signal is communicated to each pulse generator. Again, pulse generator 42 shall be evaluated in further detail. It will be appreciated, that the operation of pulse generator 42 is substantially similar to the operation of the remaining pulse generators 44, 46 and 48.

As shown in FIG. 10, pulse generator 42 includes an inverter 222 which receives the rising edge of signal 16 and inverts signal 16. Inverter 222 is coupled in parallel to four inverters 224, 226, 228, and 230 and generates an output signal that is similar to input signal 16. Inverter 224 is coupled in parallel to NAND gates 130 and 132. Both NAND gates 130 and 132 are two-input NAND gates that are also coupled to an enable output 114 and 116, respectively. The enable outputs 114 and 116 are generated by an enable register 108.

Each of the remaining inverters 226, 228 and 230 are also coupled to a pair of NAND gates. More particularly, inverter 226 is coupled in parallel to NAND gates 134 and 136, inverter 228 is coupled to parallel NAND gates 138 and 140, and inverter 230 is coupled to parallel NAND gates 142 and 144. Each NAND gate is also presented with the enable output signals, as previously described. In operation, the enable register output signals provide gated control of the presentation of the input rising edge to the next circuit.

The enabled output generator from each of the NAND gates is presented to each inverter which is coupled to an edge delay circuit. Inverters 232, 234, 236, 238, 240, 242, 244 and 246 are presented with the output from NAND gates 130, 132, 134, 136, 138, 140, 142, and 144, respectively. The output from each of the inverters 232, 234, 236, 238, 240, 242, 244 and 246 is presented to edge delay circuits 50, 51, 52, 53, 54, 55, 56 and 57, respectively. Each "enabled" edge delay circuit is presented with the same rising edge input pulse signal 16 and generates an edge delay which is delayed according to the programmed edge delay period.

The edge delay circuits function in pairs where the first edge delay circuit generates the leading edge of a pulse, and the second edge delay circuit generates the trailing edge of the pulse. By way of example and not of limitation, each pulse generator has four pairs of edge delay circuits. As shown in FIG. 10, for pulse generator 42, edge delay circuits 50, 52, 54, and 56 are associated with generating the leading edge of each pulse. Edge delay circuits 51, 53, 55 and 57 are coupled to inverters 60, 61, 62 and 63, respectively, and generate the trailing edge of the pull-up turn-on signals.

Referring now to FIG. 11, there is shown an edge delay circuit 50. Edge delay circuit 50 is similar to edge delay circuits 51, 52, 53, 54, 55, 56 and 57 of pulse generator 42. Edge delay circuit 50 is presented with a rising edge input pulse which is communicated to a pair of inverters 248 and 250. Inverters 248 and 250 operate as filters and remove noise communicated by the input rising edge. The rising edge 16 is delayed according to configuration of the switched capacitor bank. The pair of inverters 252 and 254 operate as filters as do inverters 256 and 258. An additional edge delay circuit embodiment (not shown) incorporates a pair of inverters between each transmission gate. The purpose for the additional inverters is to minimize signal degradation which may be generated by each of the RC circuits.

Referring back to FIG. 10, the leading edge and trailing edge of the pulse signals produced by each pair of edge delay circuits are combined with a NAND gate. More particularly, NAND gate 64, 65, 66 and 67 receives the leading edge signal generated by edge delay circuit 50, 52, 54 and 56 and the trailing edge signal generated by inverters 60, 61, 62 and 63, respectively. The pulsed signals associated with NAND gates 64 and 65 are further combined with NAND gate 68. The pulsed signals generated by NAND gates 66 and 67 are combined with NAND gate 69. Finally, the NOR gate 70 combines the output from NAND gate 68 and NAND gate 69. For pulse generator 42, the output generated by NOR gate 70 is an active low current plurality of pulses identified as the pull-up turn-on signals 26.

The logic circuit for combining the edge delayed pulse signals of pulse generators 44, 46 and 48 is similar to the combinational logic used in pulse generator 42. Those with ordinary skill in the art will also appreciate that various other types of logic circuits may be used to combine the edge delayed pulse signals.

The output generated by the pulse generators 42, 44, 46 and 48 comprises a pull-up turn-on signal, pull-up turn-off signal, pull-down turn-on signal and a pull-down turn-off signal, respectively. Each of the pulse generator output signals are communicated to the transistor drive system 22.

Figure 12:
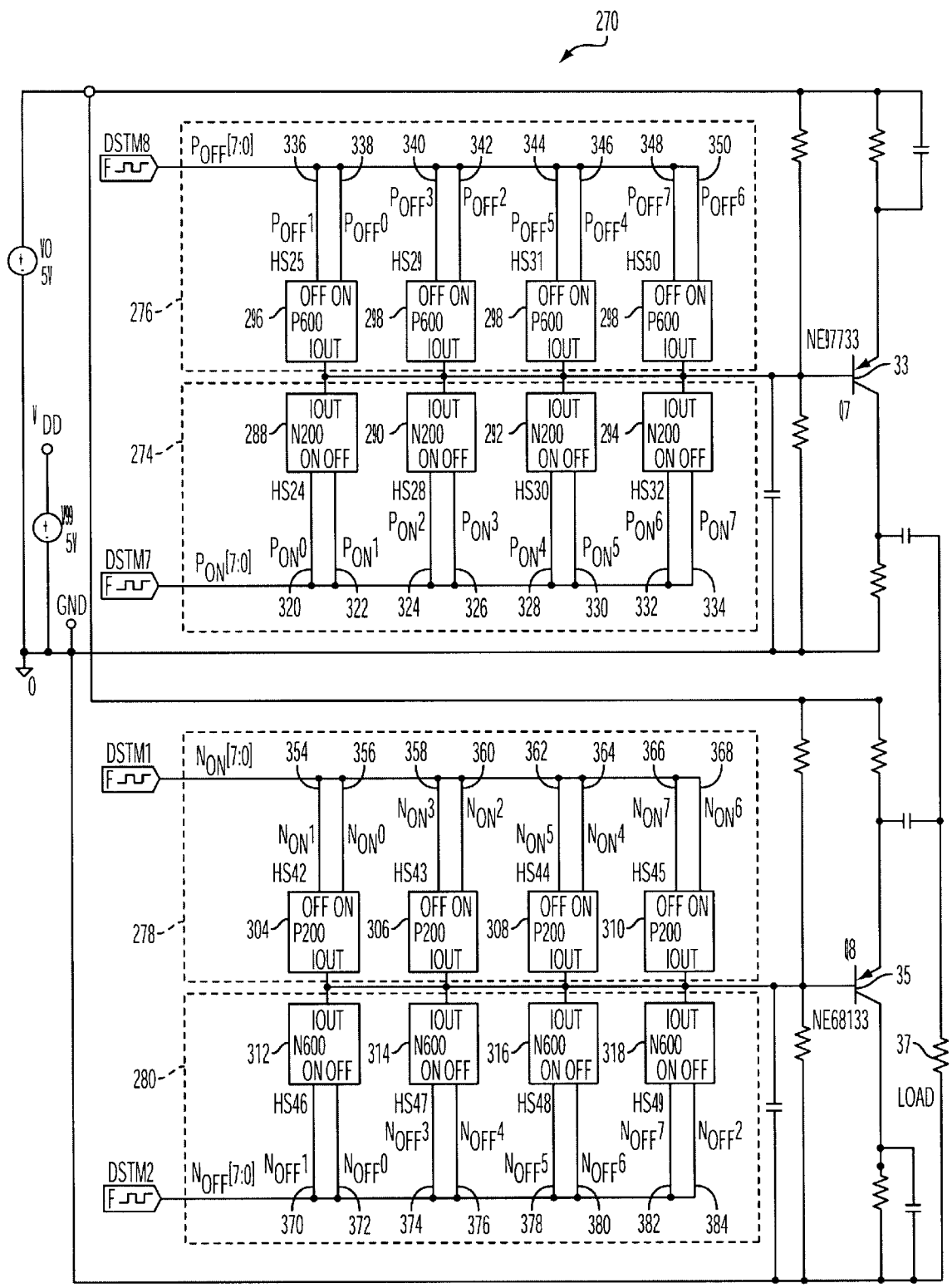
FIG. 12 is a functional block diagram of the transistor drive system.

Referring now to FIG. 12, there is shown the functional block diagram 270 of the signal generators' logic circuits which are coupled to the edge delay circuits described above. The output signals from pulse generator 42 edge delay circuits are presented to a pull-up turn-on current driver system 274. The output signals from the edge delay circuits of pulse generator 44, 46, and 48 are presented to a pull-up turn-off current driver system 276, pull-down turn-on current driver system 278, and pull-down turn-off current driver system 280, respectively.

Each of the current driver systems is presented with delayed edges generated by each edge delay circuit and functions as a 4 input wired-OR gate. Each current driver also comprises a series of inverters which function as step-up amplifiers to provide enough base drive for the pnp and npn transistors. The particular circuit diagram for each current driver is described in more detail in FIG. 13, FIG. 14, FIG. 15 and FIG. 16.

Referring back to FIG. 12, there is shown the output from pulse generator 42 edge delay circuits is presented to the pull-up turn-on current driver system 274 which comprises current drivers 288, 290, 292 and 294. The output from pulse generator 44 edge delay circuits are communicated to pull-up turn-off current driver system 276 which comprises current drivers 296, 298, 300 and 302. The output from pulse generator 46 edge delay circuits are communicated to pull-down turn-on current driver system 278 which comprises current drivers 304, 306, 308 and 310. The output from pulse generator 48 edge delay circuits are communicated to pull-down turn-off current driver system 280 which comprises current drivers 312, 314, 316 and 318.

In operation, each current driver combines with the leading and trailing edge of the pull-up turn-on signals, pull-up turn-off signals, pull-down turn-on signals and pull-down turn-off signals. Each current driver has inverters coupled in series which function as step-up amplifiers for the leading and trailing edges generated by each edge delay circuit from each pulse generator. Additionally, each current driver has a pair of coupled FETs which operate as AND gates that combine the leading and trailing edges of the input signals. The composite of delayed output signals generated by the current drivers are then presented to the bipolar transistor circuit previously described.

More particularly, pull-up turn-on current driver 288 has a first input 320 which is presented with the leading edge of a pull-up turn-on signal which was generated by edge delay circuit 50. Pull-up turn-on current driver 288 has a second input 322 which corresponds to the trailing edge generated by edge delay circuit 51 and inverter 60. The pull-up turn-on current driver 288 operates as a step-up amplifier and combines the leading edge input 320 and with the trailing edge input 322. Note that pull-up turn-on current drivers 290, 292 and 294 receive inputs 324, 326, 328, 330, 332 and 334 which correspond to the leading edges generated by each edge delay circuit of pulse generator 42.

Similarly, pull-up turn-off current drivers 296, 298, 300 and 302 is presented with outputs 336, 338, 340, 342, 344, 346, 348, and 350 from edge delay circuits of pulse generator 44. The output from both the pull-up turn-on current driver system and the pull-up turn-off driver system are combined and presented to the base of pnp bipolar transistor 33.

Pull-down turn-on current drivers 304, 306, 308 and 310 is presented with outputs 354, 356, 358, 360, 362, 364, 366 and 368 from pulse generator 46 edge delay circuits. Pull-down turn-off current drivers 312, 314, 316 and 318 receive inputs 370, 372, 374, 376, 378, 380, 382 and 384 from pulse generator 48 edge delay circuit. The output from both the pull-down turn-on current driver system 278 and the pull-down turn-off current driver system 280 are combined and communicated to the base of a npn bipolar transistor 35.

Figure 13:
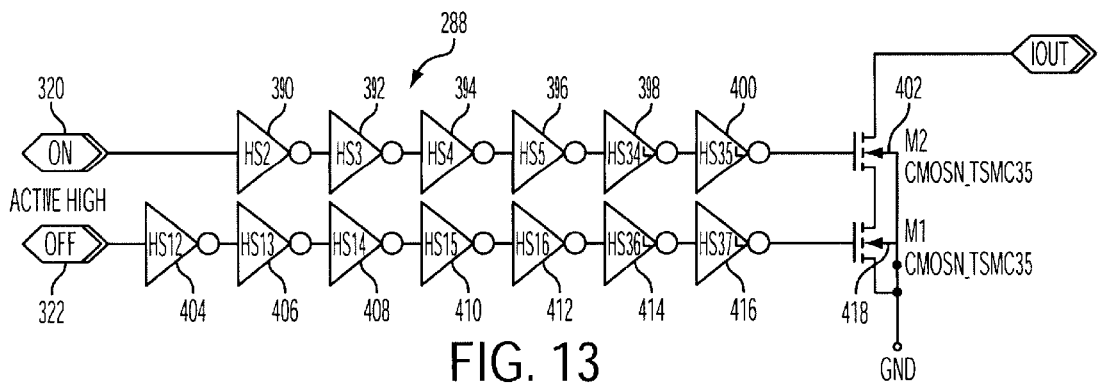
FIG. 13 is a circuit diagram of the pull-up turn-on circuit.

Referring to FIG. 13, there is shown a circuit diagram for pull-up turn-on current driver 288. Pull-up turn-on current driver 288 is presented with a leading edge input 320 and trailing edge input 322 generated by pulse generator 42. Edge input 320 is processed by a series of inverters 390, 392, 394, 396, 398 and 400 which function as step-up amplifiers. The output from inverter 400 is coupled to an n-channel FET 402. Trailing edge input 322 is also processed by a series of inverters 404, 406, 408, 410, 412, 414 and 416 which are also coupled to a n-channel FET 418. N-channel FET 402 and n-channel FET 418 are coupled and combine the leading edge signal from inverter 400 with the trailing edge signal from inverter 418. The combined output pulse signal generated by FET 402 and FET 418 is communicated to bipolar transistor 33. The circuit design applicable to current driver 286 is also applicable to current drivers 290, 292 and 294. The four current drivers are coupled and function as a 4 input wired-OR gate, which generate pull-up turn-on signals.

Figure 14:
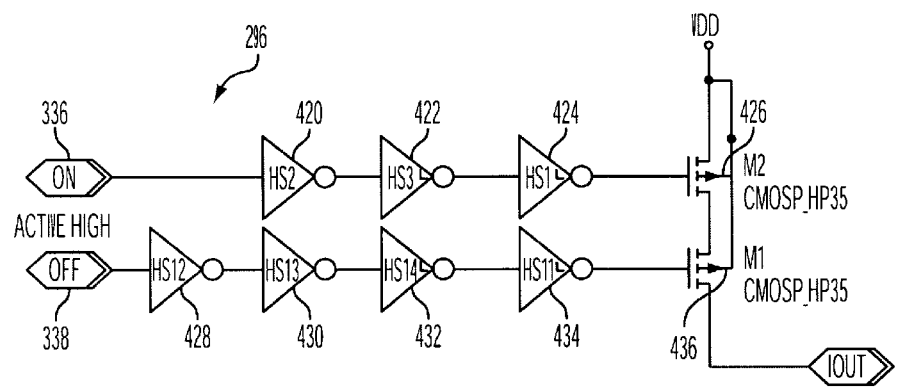
FIG. 14 is a circuit diagram of the pull-up turn-off circuit.

Referring now to FIG. 14, there is shown the pull-up turn-off current driver 296 having an input signal 336 which comprises the leading edge of a pulse generated by pulse generator 44. The edge input 336 is electrically coupled to a series of inverters 420, 422 and 424 which function as step-up amplifiers. The output of inverter 424 is coupled to the gate of a p-channel FET 426. The input edge 338 corresponds to the trailing edge of a pulse generated by pulse generator 43. Input edge 338 is coupled to inverters 428, 430, 432 and 434 which function as a step-up amplifier whose output is presented to the gate of a p-channel FET 436. The p-channel FET 426 is coupled to p-channel FET 436, and the output is communicated to the gate of bipolar transistor 33. Note that the circuit design applicable to current driver 296 is also applicable to current drivers 298, 300 and 302. In operation, the four current drivers 296, 298, 300 and 302 are coupled and function as a 4 input wired-OR gate, which produces the pull-up turn-off signals.

Figure 15:
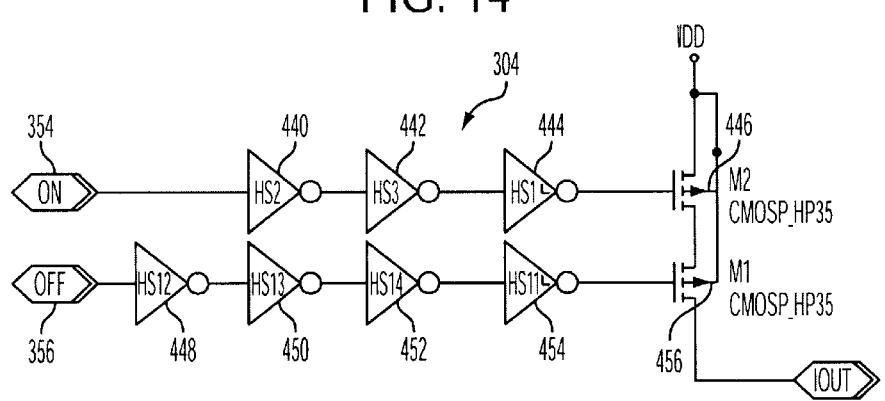
FIG. 15 is a circuit diagram of the pull-down turn-on circuit.

Referring now to FIG. 15, there is shown the pull-down turn-on current driver 304 having the input edge 354 which corresponds to the leading edge of a pulse formed by pulse generator 46 and communicated as the pull-down turn-on signal. As previously described, serially coupled inverters 440, 442 and 444 function as scale-up amplifiers which communicate with the gate of a p-channel FET 446. The input signal 356 corresponds to the trailing edge of a pulse generated by pulse generator 44. Another set of inverters 448, 450, 452 and 454 are coupled in series to a p-channel FET 456. The coupling of FET 456 with FET 446 performs the function of combining the leading edge from inverter 444 with the trailing edge from inverter 454 and the pulse output is transmitted to the base of bipolar transistor 35. It shall be appreciated that the circuit design of current driver 304 is the same as the circuit design for current drivers 306, 308 and 310. In operation the four current driver 304, 306, 308, and 310 are coupled and function as a 4 input wired-OR gate which generates the pull-down turn-on signals.

Figure 16:
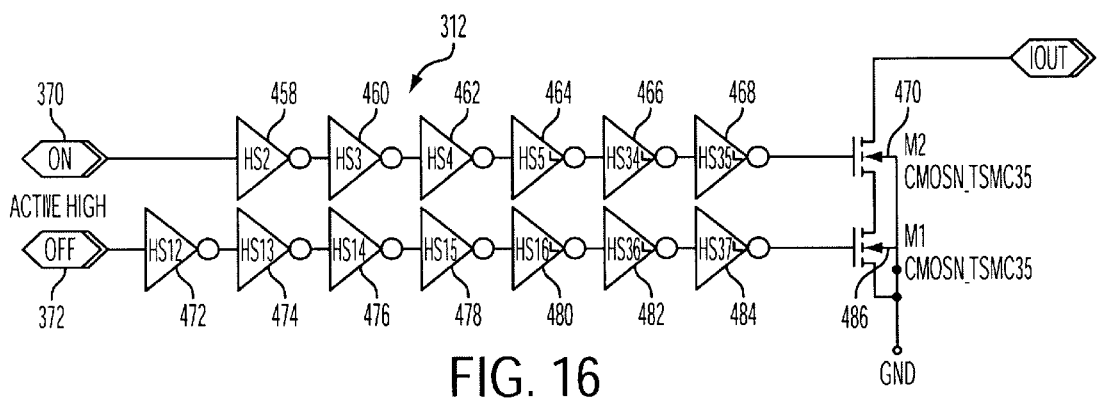
FIG. 16 is a circuit diagram of the pull-down turn-off circuit.

Referring now to FIG. 16, there is shown the pull-up turn-off current driver 312 having an input edge 370. The input edge 370 corresponds to the leading edge of a signal produced by pulse generator 48. The leading edge 370 is transmitted to inverters 454, 460, 462, 464, 466 and 468 which are connected in series. The inverters function as scale-up amplifiers where the output of inverter 468 is presented to a n-channel FET 470. Another input signal 372 corresponding to the trailing edge of a signal generated by pulse generator 45 is presented to a series of inverters 472, 474, 476, 478, 480, 482, and 484 which function as step-up or scale-up amplifier. The output from inverter 484 is communicated to the gate of an n-channel FET 486. The FETs 470 and 486 are coupled to generate an pull-down turn-off pulse signal having a leading edge and a trailing edge which is communicated to transistor 35. The circuit design for current driver 312 is the same circuit design that would be used by current drivers 314, 316, and 318. In operation the four current drivers 312, 314, 316, and 318 are coupled and function as a 4 input wired-OR gate which generates the pull-down turn-off signals.

Figure 17:
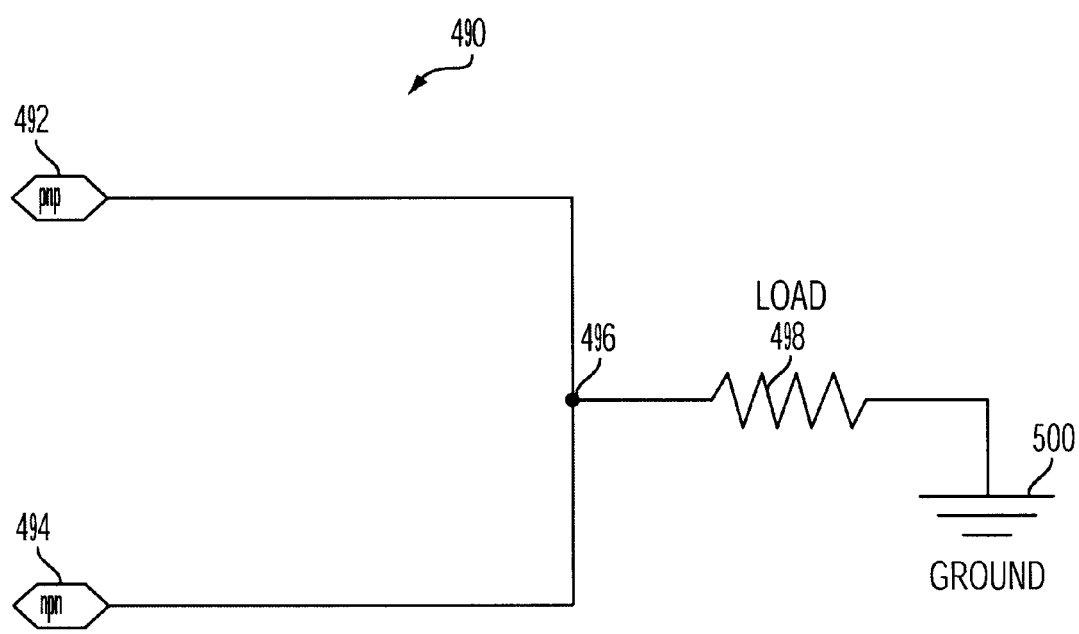
FIG. 17 is an alternative embodiment of FIG. 5 where the pull-up circuit signals and pull-down circuit signals are coupled to a load.

Referring to FIG. 17 there is shown an alternative embodiment 490 of FIG. 5 where the pull-up circuit signals 492 and pull-down circuit signals 494 are coupled to a load. This alternative embodiment reflects a circuit which does not employ the pnp transistor of the pull-up circuit and the npn transistor of the pull-down circuit. In this circuit, the pull-up signals 492 and the pull-down signals 494 are tied together to a node 496 which drives a load 498 that is ground 500. The load 498 coupled to ground 500 may be an antenna.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An apparatus for generating a baseband signal from a data pulse to approximate a filter transfer function, comprising:

an input node coupled that receives said data pulse;

an output node;

a pull-up circuit coupled to said output node which generates positive going excursions of the baseband signal; and a pull-down circuit coupled to said output node which generates negative going excursions of the baseband signal.

2. An apparatus for generating a baseband signal as recited in claim 1, wherein said pull-up circuit and said pull-down circuit comprise:

a plurality of edge delay circuits which receive said data pulse and generate a plurality of delayed leading edges which are combined to generate said positive going excursions and said negative going excursions.

3. An apparatus for generating a baseband signal as recited in claim 2, wherein said edge delay circuits further comprise a switched bank of capacitors which provide a programmable edge delay.

4. An apparatus for generating a baseband signal as recited in claim 3, comprising, an antenna presented with output from said pull-up circuit and said pull-down circuit to transmit said baseband signal.

5. An apparatus for generating a baseband signal having a plurality of positive going and negative going excursions generated from an input pulse, comprising:

an input node coupled to a source of said input pulse;

an output node;

a pull-up circuit coupled to said output node;

a pull-down circuit coupled to said output node;

a first plurality of pairs of pulse generators in said pull-up circuit coupled to said input node, each of said first plurality generating a pull-up turn-on signal and a pull-up turn-off signal for each of one of a plurality of positive-going excursions of the baseband signal; and a second plurality of pairs of pulse generators in said pull-down circuit coupled to said input node, each of said second plurality generating a pull-down turn-on signal and a pull-down turn off signal for each one of a plurality of negative-going excursions of the baseband signal.

6. The baseband signal generator of claim 5, where said pull-up circuit and said pull-down circuit further comprise:

a pnp bipolar transistor presented with said plurality of first turn-on signals and said plurality of first turn-off signals to generate said plurality of positive going excursions;

a npn bipolar transistor coupled to said pnp transistor presented with said plurality of second turn-on signals and said plurality of second turn-off signals to generate said plurality of negative going excursions; and circuitry configured to generate a waveform that combines said plurality of positive-going excursions and said plurality of negative-going excursions.

7. The baseband signal generator of claim 5, comprising an antenna coupled to said output node for transmitting said positive going excursions and said negative going excursions.

8. The baseband signal generator of claim 6, comprising an antenna coupled to said pnp transistor and said npn transistor for transmitting said positive going excursions and said negative going excursions.

9. The baseband signal generator of claim 5 where said pull-up circuit and said pull-down circuit further comprise:

a node receiving a one of said plurality of pull-down signals and said plurality of pull-up signals; and a load coupled to said node.

10. The baseband signal generator of claim 9 where where said load comprises an antenna for wireless communication.

11. A method for generating a baseband signal having a plurality of positive going and negative going excursions from an input pulse comprising:

providing an input node coupled to a source of said input pulse;

providing an output node;

providing a pull-up circuit coupled to said output node;

providing a pull-down circuit coupled to said output node;

generating a pull-up turn-on signal and pull-up turn-off signal for each one of a plurality of positive-going excursions of the baseband signal; and generating a pull-down turn-on signal and a pull-down turn-off signal for each one of a plurality of negative going excursions of the baseband signal.

\* \* \* \* \*